(12) United States Patent
Mitani

(10) Patent No.: US 7,038,921 B2
(45) Date of Patent: May 2, 2006

(54) ELECTRONIC APPARATUS

(75) Inventor: Amane Mitani, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/863,351

(22) Filed: Jun. 9, 2004

(65) Prior Publication Data
US 2004/0252473 A1 Dec. 16, 2004

(30) Foreign Application Priority Data
Jun. 12, 2003 (JP) ............................. 2003-167852

(51) Int. Cl.
*H05K 7/02* (2006.01)
*H01H 73/02* (2006.01)

(52) U.S. Cl. ...................... 361/809; 361/115; 174/52.1

(58) Field of Classification Search ........ 361/728–730, 361/752, 807, 808, 809, 115; 174/50, 52.1; 200/19.22, 19.26, 19.3
See application file for complete search history.

(56) References Cited

U.S. PATENT DOCUMENTS 5,563,756 A * 10/1996 Ignasiak ...................... 361/42
5,864,453 A * 1/1999 Wieloch et al. ............... 361/14
6,388,554 B1 * 5/2002 Yamaguchi ................. 337/401

FOREIGN PATENT DOCUMENTS

JP 2001-266704 A 9/2001

* cited by examiner

*Primary Examiner*—Kamand Cuneo
*Assistant Examiner*—Dameon E. Levi
(74) *Attorney, Agent, or Firm*—Sughrue Mion, PLLC

(57) ABSTRACT

A chassis built in a panel is provided with a supporter for supporting a printed wiring board mounted with an electronic component, and the printed wiring board is provided with a board-opening portion in the proximity of this supporter. When a load F applied on a knob from a predetermined direction, the printed wiring board can be ruptured from the board-opening portion to get detached from the supporter, thereby lowering the height of the outward projection of the knob from the panel.

12 Claims, 4 Drawing Sheets

ELECTRONIC APPARATUS

BACKGROUND OF THE INVENTION

1. Field of the Invention

The present invention relates to an electronic apparatus having a mechanism for absorbing a load applied thereon by external shocks, particularly suitable for on-vehicle equipments.

2. Description of the Related Art

In order to protect occupants sitting in a driver's seat and in a passenger's seat of a vehicle in the event of a car crash, standards are provided for various meters and audio devices built in the front instrument panel of a car compartment so that a protrusion such as operating knobs does not damage their human bodies upon the crash.

For example, the standard of Europe (EEC standard) provides that the maximum amount of projection (height) from a panel plane shall be controlled at 9.5 mm or less when a static load of 37.8 daN is applied onto the protrusion such as operating knobs.

For example, JP-A-2001-266704 discloses, as an electronic apparatus aimed at assuring the safety of the above-mentioned occupants, an electronic apparatus such that a load can be absorbed by breaking the operating knob itself because of the load to be applied thereon by a shock on a car crash, thereby reducing the aforementioned amount of projection.

Since the conventional electronic apparatus is constructed as mentioned above, there is a limit to the load absorption of the shock based on the breakage of the operating knob itself, and therefor the amount of projection may not be suppressed.

In this case, in order to meet the EEC standard, the shape of the knob is obliged to be changed (for example, the height thereof is lowered). Consequently, there is the problem that some constraints are added to the design of the knob and the like.

SUMMARY OF THE INVENTION

The present invention has been accomplished to solve the above-mentioned problem. An object of the present invention is to provide an electronic apparatus such that a load applied thereon by a shock can be absorbed more effectively as compared to the conventional without any constraints on the design of a knob, and that the above EEC standard can be satisfied.

An electronic apparatus according to the present invention comprises: a printed wiring board secured on the chassis and having an electronic component mounted on the board; a panel having the chassis built in the panel; and an operating knob connected with the electronic component, and projecting outwardly from the surface of the panel, wherein the printed wiring board includes a load absorption means in which the printed wiring board can be ruptured at a predetermined place by a load applied on the knob to get detached from the chassis in the direction of the load, thereby reducing the height of the outward projection of the knob.

Therefore, according to the present invention, the load applied on the knob can be absorbed more effectively as compared to the conventional without any constraints on the design of the knob, and the given standard can be satisfied.

DETAILED DESCRIPTION OF THE PREFERRED EMBODIMENTS

An embodiment of the present invention will be described below.

First Embodiment

Figure 1:
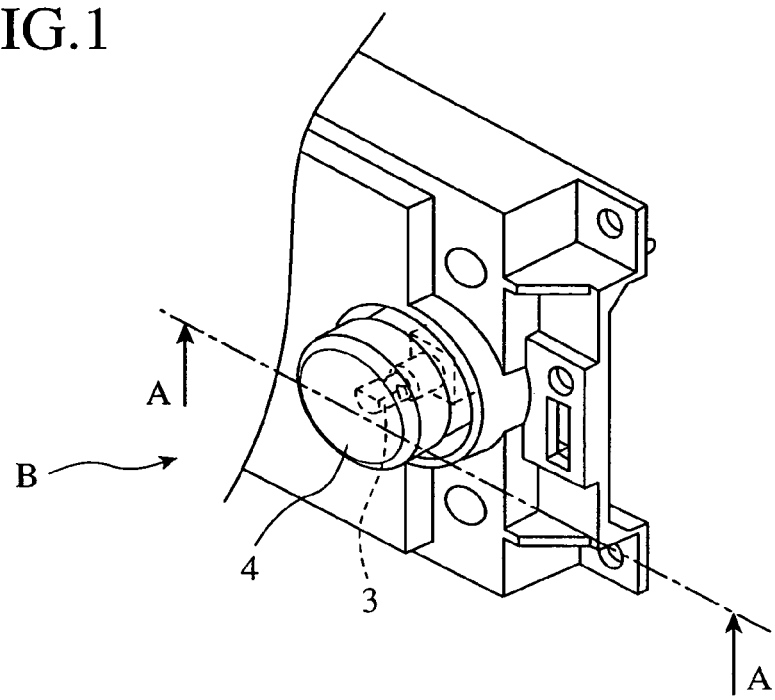
FIG. 1 is a partially perspective view of an operating knob area in a vehicle audio as an example of an electronic apparatus according to a first embodiment in the present invention.
Figure 4:
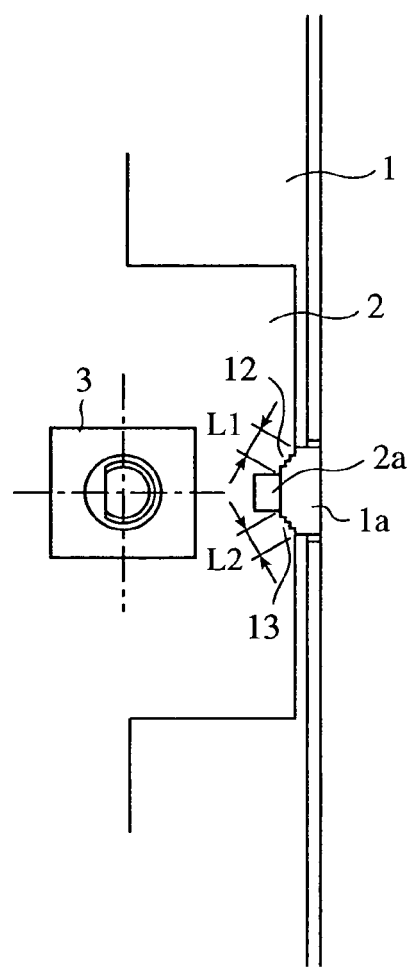
FIG. 4 is an elevation view of an essential part of the printed wiring board as seen from the direction of B in FIG. 1 for explanation of another example of modes of rupture of the printed wiring board.
Figure 2A:
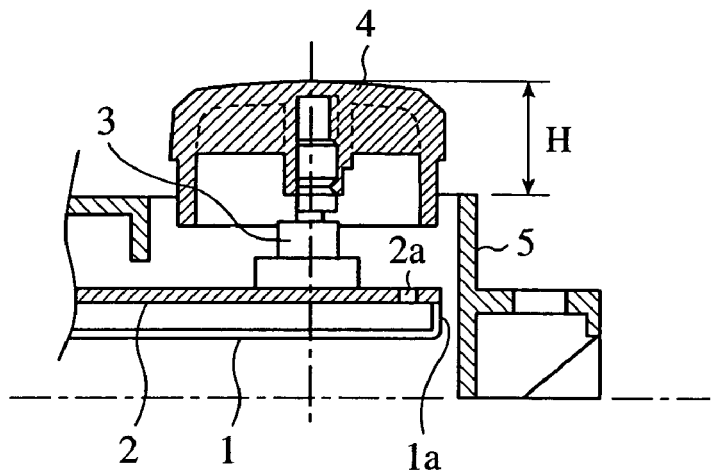
FIGS. 2A–2C are sectional views taken along the line A—A of FIG. 1 for explanation of a rupturing process of a printed wiring board of the electronic apparatus.
Figure 2B:
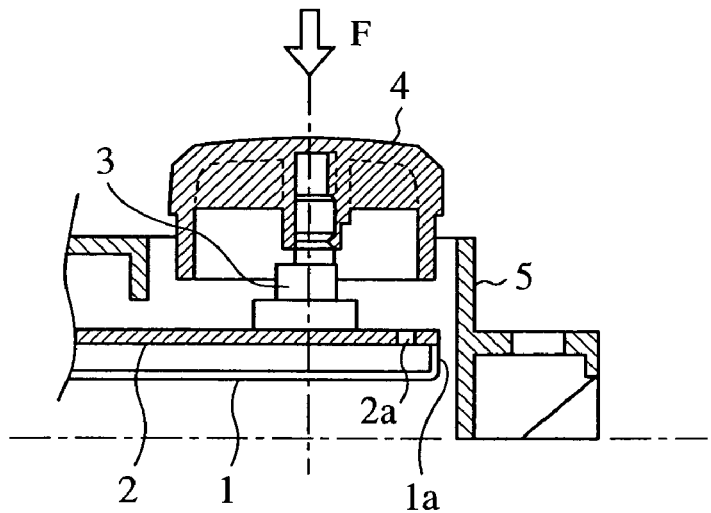
Figure 2C:
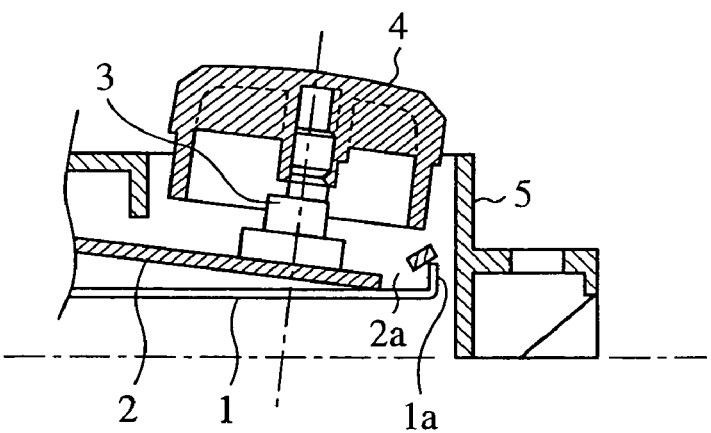
Figure 3A:
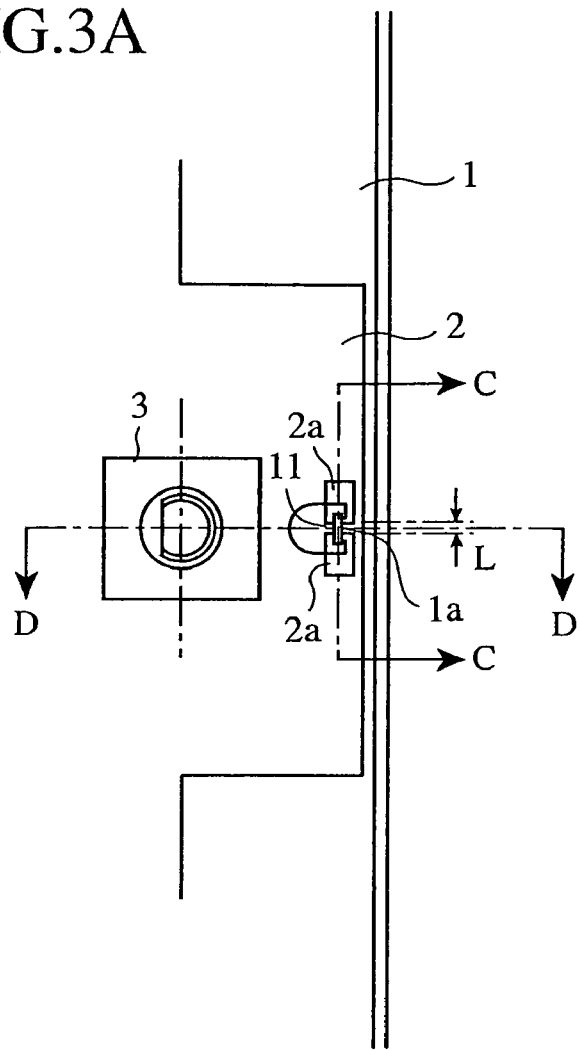
FIG. 3A is an elevation view of an essential part of the printed wiring board as seen from the direction of B in FIG. 1 for explanation of an example of modes of rupture of the printed wiring board.
Figure 3B:
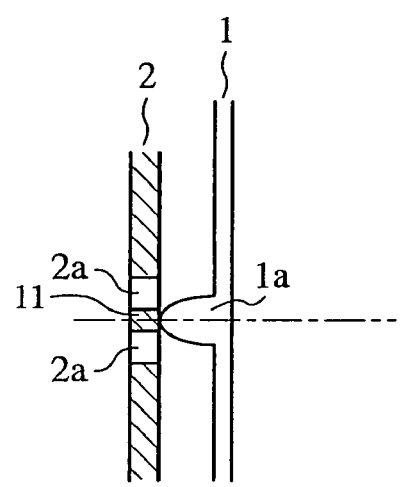
FIGS. 3B and 3C are schematic side sectional views of the essential part of the printed wiring board taken along the lines C—C and D—D in FIG. 3A, respectively.
Figure 3C:
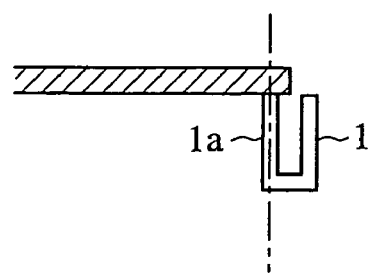

FIG. 1 is a partially perspective view of an operating knob area in a vehicle audio that is an example of an electronic apparatus according to a first embodiment in the present invention. FIGS. 2A–2C are sectional views taken along the line A—A in FIG. 1 for explanation of a rupturing process of a printed wiring board 2 of the electronic apparatus. FIG. 3A is an elevation view of an essential part of the printed wiring board 2 as seen from the direction of B in FIG. 1 for explanation of an example of modes of rupture of the printed wiring board 2. FIGS. 3B and 3C are schematic side elevation views of the essential part thereof taken along the lines C—C and D—D in FIG. 3A, respectively. FIG. 4 is an elevation view of an essential part of the printed wiring board 2 for explanation of an example of the modes of rupture in the printed wiring board, other than that shown in FIGS. 3A–3C.

Referring to FIG. 1 to FIG. 4, a chassis 1 supports a printed wiring board 2, and a slit-shaped, rectangular-shaped or the like board-opening portion 2a is provided in this printed wiring board 2. In the vicinity of this board-opening portion 2a, a supporter 1a for supporting the printed wiring board 2 is provided in the chassis 1.

While the supporter 1a and the board-opening portion 2a are designated by one place as shown in FIG. 2A to FIG. 4, the invention is not so limited to this, but it may be provided by a plurality of places if necessary.

Further, an electronic component such as a variable resistor 3 having a switching mechanism capable of turning ON or OFF when it is driven in a direction of a shaft is mounted on the printed wiring board 2. An operating knob 4 is secured on the shaft of the variable resistor 3 by means of press-insertion.

Moreover, the printed wiring board 2 mounted by the electronic component such as the variable resistor 3 is fixed and installed on the chassis 1. This chassis 1 is built in a panel 5, and the operating knob 4 projects outwardly from the front of the panel 5 by a height H of projection.

Referring to FIGS. 2A to 2C, the load absorption mechanism will now be described below.

FIG. 2A is an illustration of a normal state in which no load is applied on the electronic apparatus. In this state, the projecting height H of the knob 4 exceeds the above-mentioned value (9.5 mm) of the EEC standard.

FIG. 2B is an illustration of a state in which a load F is applied on the knob 4, such that the shaft of the variable resistor 3 is pressed into the panel 5 by a switch-stroke because of the load F. After the shaft is pressed there into by the switch-stroke, the load F is applied on the printed wiring board 2 through the variable resistor 3, and thereby the printed wiring board 2 begins to bend in the direction of the load F (not shown). At that time, the height H of projection of the knob 4 maybe lowered corresponding the amount of the bending. Note that types of the load include an impact load and a static load.

When the load F further presses the knob 4 thereinto, the printed wiring board 2 will be finally ruptured from the board-opening portion 2a as shown in FIG. 2C to get detached from the supporter 1a in the applied direction of the load F, resulting in a state shown in FIG. 2C. This rupture of the printed wiring board 2 can lower the height H of projection of the knob 4 to thus satisfy the aforementioned EEC standard.

In this case, an opening (not shown) may be provided on the chassis 1 side such that a part on the ruptured side of the printed wiring board 2 projects through the chassis 1. This opening on the chassis 1 side allows a part of the ruptured side of the printed wiring board 2 to fall therein still more, which can further lower the height H of projection of the knob 4.

In an electronic apparatus of this type, a support has been usually provided on the back side of an electronic component such as the variable resistor 3 in order to prevent the bending of the printed wiring board. However, such a support shall be restricted to enable the rupture of the printed wiring board 2 and the state as shown in FIG. 2C.

Referring to FIGS. 3A–3C, and FIG. 4, the rupture of the printed wiring board 2 will now be described below.

As shown in FIG. 3A, there is an example such that two rectangular-shaped board-opening portions 2a are prepared adjacent to each other at one end of the printed wiring board 2, and that a supporter 1a for supporting the printed wiring board 2 is provided between the two board-opening portions 2a. A state where the supporter 1a supports the printed wiring board is shown in side cross-section taken along the lines C—C and D—D in FIGS. 3B and 3C, respectively. As shown in the two figures, supporting of the supporter 1a is considered as nearly "One Point Supporting."

One end of the printed wiring board 2 is put in a state free from the support except for this supporter 1a.

The supporter 1a can be formed by cutting (slitting) a part of the chassis 1 and raising the part.

Assuming that the load F is applied on the printed wiring board from above in a direction perpendicular to the paper face of FIG. 3A, the load F imposes a great stress on the vicinal part of the board-opening portions 2a with the supporter 1a serving as a fulcrum. This vicinal part is placed in an extreme weak situation for the stress due to the board-opening portions 2a.

Therefore, when the stress imposed by the load F exceeds a given limit, the printed wiring board 2 can be ruptured at the place indicated by the numeral 11. Thus, the printed wiring board 2 loses the support by the supporter 1a, and comes to the state as shown in FIG. 2C.

As mentioned above, the printed wiring board 2 can be ruptured by the load F. The relationship between the load F and the rupture can be controlled by adjusting the distance L shown in the figure. This distance L represents the shortest distance between the two board-opening portions 2a in a portion positioned just above the supporter 1a. This portion in the printed wiring board 2 may be ruptured most easily. The shorter the distance L, the smaller the load F capable of rupturing the printed wiring board 2 is.

Needless to say, the distance L depends upon the thickness and material characteristics of the printed wiring board 2 and further the size of the board-opening portion 2a and so on.

Therefore, the distance L to be ruptured by the load F will be determined according to the thickness, material characteristics of the printed wiring board 2 and so on.

In contrast to FIGS. 3A–3C, FIG. 4 is an illustration of an example provided with one board-opening portion 2a in the printed wiring board 2 in the vicinity of the supporter 1a. Such a supporter 1a is formed at the side of the chassis 1.

The mechanism which causes the printed wiring board to rupture is similar to that shown in FIGS. 3A–3C. The portion in the vicinity of the supporter 1a is put in an extremely weak state for the stress.

Therefore, when the stress imposed by the load F exceeds a predetermined limit, the printed wiring board 2 is ruptured at the two places indicated by the numerals 12 and 13, and comes to the state as shown in FIG. 2C.

In the example as shown in FIG. 4, the relationship between the load F and the rupture can be controlled by adjusting the distances L1 and L2 as shown in the figure. Each of the distances L1 and L2 is supposed to be the shortest distance between the board-opening portion 2a and the side of the printed wiring board 2. The places of the distances L1 and L2 will be ruptured most easily. The shorter the distance L1 or L2, the smaller the load F capable of rupturing the printed wiring board is.

Similarly to the example as shown in FIGS. 3A–3C, the distances L1 and L2 depend on the thickness and material characteristics of the printed wiring board 2 and further the size of the board-opening portion 2a and the like.

Therefore, the distances L1 and L2 to be ruptured by the load F will be determined according to the thickness, material characteristics of the printed wiring board 2 and so on.

In the above description, the board-opening portion 2a is provided at the end of the printed wiring board 2. However, for example, as shown in FIGS. 3A–3C, a plurality of the board-opening portions 2a and the supporter 1a may be provided around the electronic component located in the central portion of the substrate and applied thereon by the load F. In this case, an inner part of the printed wiring board 2 surrounded by these board-opening portions 2a will be ruptured by the load F.

As mentioned above, according to the first embodiment, the electronic apparatus where the operating knob 4 secured to the variable resistor 3, for example, outwardly projects from the panel 5 is constituted by including: the supporter 1a for supporting the printed wiring board 2 by one or a plurality of places; the one or two openings formed in the vicinity of each supporter 1a; and the load absorption mechanism such that the printed wiring board 2 can be ruptured from the board-opening portions 2a by the load F applied on the knob 4 to get detached from the supporter 1a, thereby lowering the height H of outward projection of the knob 4. Consequently, the shock applied on the knob 4 can be absorbed more easily than the conventional without any constraints on the design of the knob 4, and the resultant electronic apparatus can meet the given EEC standard.

Furthermore, according to the first embodiment, an opening can be provided in the chassis 1 such that a part on the ruptured side of the printed wiring board 2 projects through the chassis 1. This enables a part on the ruptured side of the printed wiring board 2 to be sunk more easily, thereby further lowering the height H of projection of the knob 4.

Second Embodiment

Figure 5A:
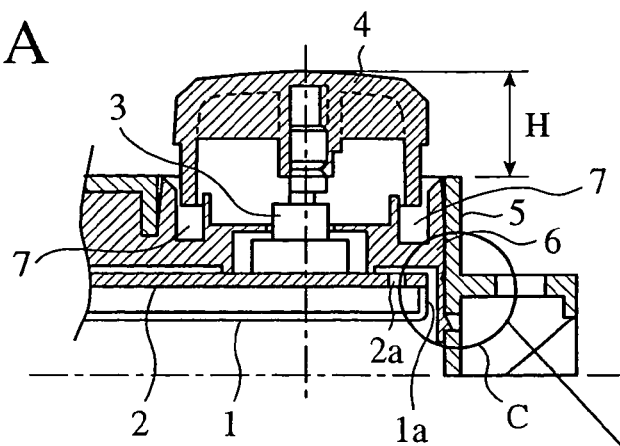
FIGS. 5A–5C are partial sectional views of an operating knob area in a vehicle audio as an example of an electronic apparatus according to a second embodiment in the present invention for explanation of a rupturing process of a printed wiring board of the electronic apparatus.
Figure 5D:
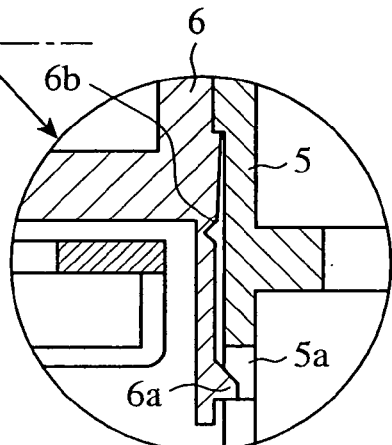
FIG. 5D is a partially enlarged view of a C area in FIG. 5A.
Figure 5B:
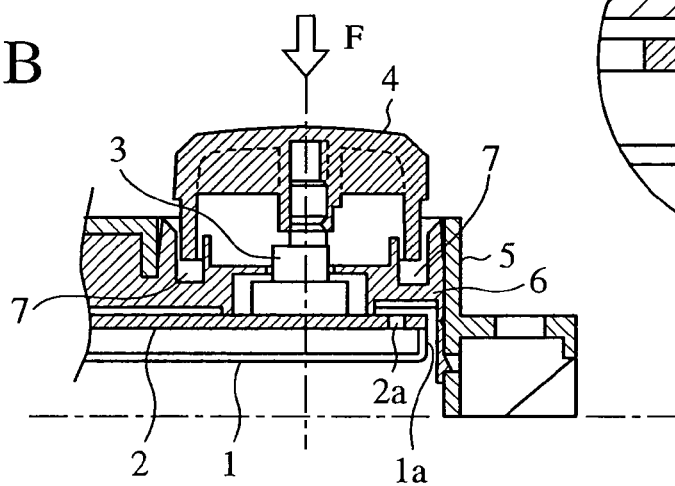
Figure 5C:
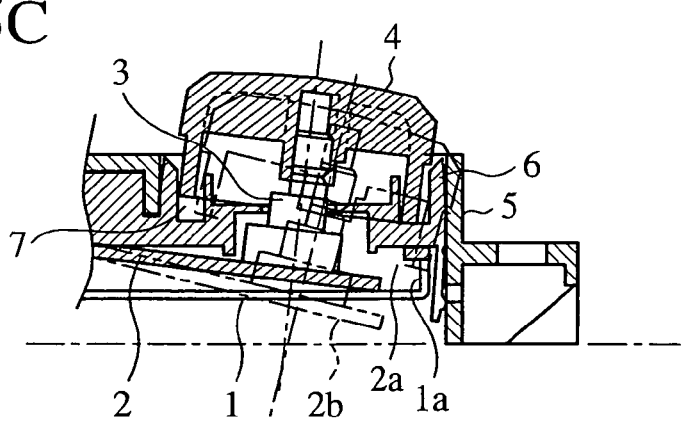

FIGS. 5A–5C are partial sectional views of an operating knob area in a vehicle audio as an example of an electronic apparatus according to a second embodiment in the present invention, corresponding to the aforementioned FIGS. 2A–2C, respectively, and FIG. 5D is a partially enlarged view of a C area in FIG. 5A.

In FIGS. 5A–5D, the same parts as the ones in FIGS. 2A–2C are designated by similar numerals.

The electronic apparatus as shown in FIGS. 5A–5D is different from the one as shown in FIGS. 2A–2C in that a light guiding plate 6 for guiding the light emitted from a light source to the front side of a panel 5 is provided and secured within the panel 5 as shown in the figures.

As shown in FIG. 5D, an engaging portion 6a of the light guiding plate 6 engages an engaging cavity 5a of the panel 5, thereby fixing the light guiding plate 6 within the panel 5 separately from the printed wiring board 2.

Moreover, as shown in FIG. 5A, a space 7 is prepared in the light guiding plate 6 so that the knob 4 can be pressed into the panel 5 by a switch-stroke upon operating of a switch mechanism of a variable resistor 3.

The load absorption mechanism will now be described below.

FIG. 5A is an illustration of a normal state in which no load is applied on the knob. The height H of projection of the knob 4 in this state is similar to that of the knob 4 as shown in FIG. 2A.

FIG. 5B is an illustration of the state in which a load F is applied on this knob 4, showing the state in which the shaft of the variable resistor 3 is pressed into the panel by the switch-stroke because of the load F. After the shaft is pressed thereinto by the switch-stroke, the printed wiring board 2 is loaded with the load F through the variable resistor 3, and thereby the printed wiring board 2 begins to bend in the direction of the load F (not shown). At that time, the height H of projection of the knob 4 is lowered by the bending, and a lower end of the knob 4 abuts on the bottom of the space 7. In such a way, the load F is held by the secured light guiding plate 6, and the load F is not further applied on the printed wiring board 2, thereby making impossible the rupture of the printed wiring board 2.

Thus, upon the occurrence of the load F onto the knob 4, the height H of projection of the knob 4 cannot be inconveniently lowered at a given level or less. In order to avoid such an inconvenience, it is required that the light guide plate 5 just get detached from its fixed state upon the occurrence of the load F.

For this reason, as shown in FIG. 5D, for example, a V-shaped groove or recess 6b in cross-section is prepared in a certain portion of the light guiding plate 6, and thereby the thickness of the portion thereof can be reduced, rendering a structure of the light guiding plate 6 to be easily elastically deformed.

Thus, the above V-shaped groove 6b can serve as a load-absorption assisting means for releasing the securing of the light guiding plate 6 within the panel 5 to thereby assist the load F applied on the knob 4 to be worked on the printed wiring board 2.

This structure allows the light guiding plate 6 to get detached easily from its secured situation because of the load F, resulting in applying the load F on the printed wiring board 2 through the detached light guiding plate 6.

As a result, when the knob 4 is pressed thereinto by the load F, as finally shown in FIG. 5C, the printed wiring board 2 can be ruptured from the board-opening portion 2a to get detached from the supporter 1a in the direction of the load F, coming to the state as shown in the figure. This rupture of the printed wiring board 2 can lower the height H of projection of the knob 4, resulting in satisfying the above EEC standard.

Similarly to the first embodiment, an opening can be prepared in the chassis side so that a part on the ruptured side of the printed wiring board 2 can project through the chassis, and the support on the back side of the electronic component such as the variable resistor 3 can be limited.

The load-absorption assisting mechanism in FIGS. 5A–5D as described above is an example employing the light guiding plate 6 as a component interrupting the transmission of the load F with respect to the printed wiring board 2. However, needless to say, the invention is not so limited to this, but it will be also applicable to other components.

As mentioned above, in addition to the supporter 1a and the board-opening portion 2a similar to the ones in the first embodiment, the electronic apparatus according to the second embodiment further includes: the load-absorption assisting mechanism that is composed of the V-shaped groove 6b for releasing the securing of the light guiding plate 6 within the panel 5 and then making the load F applied on the knob 4 work on the printed wiring board 2; when the load F is applied on the knob 4, the applied load F can make the printed wiring board 2 rupture from the board-opening portion 2a to get detached from the supporters 1a by the release of the securing of the light guiding plate 6, thereby lowering the height H of outward projection of the knob 4. Therefore, even if a component interrupting the transmission of the load F to the printed wiring board 2 lies between the knob and the printed wiring board, no constraint can be added to the design of the knob 4, the load applied on the knob 4 can be absorbed more effectively as compared to the conventional, and the resultant electronic apparatus can meet the given standard.

Moreover, as shown in FIG. 5C, the provision of an opening (not shown) in the chassis 1 through which the portion 2b on the ruptured side of the printed wiring board 2 projects as shown by using chain-dotted lines can make the portion 2b on the ruptured side of the printed wiring board 2 further sink, and thereby can furthermore lower the height H of projection of the knob 4.

What is claimed is:

1. An electronic apparatus comprising:
   a chassis;
   a printed wiring board secured on the chassis and having an electronic component mounted on the board;
   a panel having the chassis built in the panel; and
   an operating knob connected with the electronic component, and outwardly projecting from the surface of the panel,
   wherein the printed wiring board comprises a load absorption mechanism which causes the printed wiring board to rupture at a predetermined place when a load is applied on the knob, such that the printed wiring board is detached from the chassis in the direction of the load, thereby reducing the height of the outward projection of the knob.

2. The electronic apparatus according to claim 1, wherein the load absorption mechanism further comprises:
   a supporter, mounted on the chassis, for supporting the printed wiring board; and
   a board-opening portion composed of one opening or a plurality of openings that are formed in the printed wiring board in the vicinity of the supporter,
   wherein the printed wiring board can be ruptured from the board-opening portion by the load applied on the knob so that the printed wiring board is detached from the supporter.

3. The electronic apparatus according to claim 1, wherein the load absorption mechanism further comprises:
   a supporter, mounted on the chassis, for supporting the printed wiring board;
   a board-opening portion composed of one opening or a plurality of openings that are formed in the printed wiring board in the vicinity of the supporter; and
   a load-absorption assisting means for releasing the securing of the electronic component secured within the panel to thereby assist the load applied on the knob to work on the printed wiring board,
   wherein when the load is applied on the knob, the printed wiring board is ruptured from the board-opening portion by the load applied on the board through the load-absorption assisting means so that the printed wiring board is detached from the supporter.

4. The electronic apparatus according to claim 2, wherein an opening is provided in the chassis such that a part on a ruptured side of the printed wiring board projects through the chassis.

5. The electronic apparatus according to claim 3, wherein an opening is provided in the chassis such that a part on a ruptured side of the printed wiring board projects through the chassis.

6. The electronic apparatus according to claim 3, wherein an opening is provided in the chassis such that a part on a ruptured side of the printed wiring board projects through the chassis.

7. The electronic apparatus according to claim 1, wherein the load adsorption mechanism comprises a recessed portion of the printed wiring board.

8. The electronic apparatus according to claim 7, wherein the recessed portion is a through hole.

9. The electronic apparatus according to claim 2, wherein the printed wiring board is held away from the chassis by the supporter, such that the printed wiring board collapses towards the chassis when the printed wiring board is ruptured.

10. The electronic apparatus according to claim 1, wherein the load absorption mechanism includes a protrusion that extends from the chassis and contacts the printed wiring board.

11. An electronic apparatus comprising:
    a chassis having a projection;
    a printed wiring board, said projection being positioned to abut the printed wiring board;
    an electronic component mounted on the board;
    an operating knob connected with the electronic component,
    wherein the printed wiring board comprises a hole and the projection abuts a portion of the printed wiring board adjacent the hole, such that the projection applies a stress force to the printed wiring board and the printed wiring board breaks when a load is applied to the knob.

12. The electronic apparatus according to claim 11, wherein a second hole is provided, such that said projection is positioned between the holes.

* * * * *